United States Patent [19]

Barber

[11] Patent Number: 4,954,790

[45] Date of Patent: Sep. 4, 1990

[54] ENHANCED COUPLED, EVEN MODE TERMINATED BALUNS, AND MIXERS AND MODULATORS CONSTRUCTED THEREFROM

[75] Inventor: Richard G. Barber, El Dorado Hills, Calif.

[73] Assignee: Avantek, Inc., Milpitas, Calif.

[21] Appl. No.: 437,510

[22] Filed: Nov. 15, 1989

[51] Int. Cl.⁵ .......................... H03C 1/14; H04B 1/26; H03H 7/42

[52] U.S. Cl. ................................ 332/164; 332/172; 333/25; 333/26; 455/327; 455/330

[58] Field of Search .................... 333/25, 26; 332/164, 332/172, 177, 178; 455/325-327, 330

[56] References Cited

U.S. PATENT DOCUMENTS

| | | |
|---|---|---|
| 3,437,948 | 4/1969 | Simons . |
| 3,459,969 | 8/1969 | Jasper .............................. 333/26 X |
| 3,492,603 | 1/1970 | Fredrick, Jr. .................. 332/172 X |
| 3,504,306 | 3/1970 | Kam . |
| 3,571,722 | 3/1971 | Vendelin . |
| 3,714,597 | 1/1973 | Reynolds . |
| 4,460,877 | 7/1984 | Sterns . |
| 4,609,879 | 9/1986 | Flachenecker et al. . |
| 4,611,179 | 9/1986 | Matsuura . |
| 4,705,967 | 11/1987 | Vasile . |
| 4,717,896 | 1/1988 | Graham .............................. 333/25 |
| 4,725,792 | 2/1988 | Lampe, Jr. . |
| 4,857,869 | 8/1989 | Terakawa et al. ..................... 333/26 |

Primary Examiner—Paul Gensler
Attorney, Agent, or Firm—Philip M. Shaw, Jr.

[57] ABSTRACT

A balun section formed of a pair of transmission lines connected between separate pairs of corresponding input and output terminals with a pair of capacitors connected in series between the output terminals and another transmission line connected in series with a resistor between the circuit ground and the interconnection between the pair of capacitors. A multisection balun is constructed from a plurality of such balun sections connected in cascade. In one embodiment, the outputs of a pair of multisection baluns are supplied to a circuit such as a mixer or the like.

25 Claims, 4 Drawing Sheets

ENHANCED COUPLED, EVEN MODE TERMINATED BALUNS, AND MIXERS AND MODULATORS CONSTRUCTED THEREFROM

TECHNICAL FIELD

This invention relates to a balun and more particularly to a microwave integrated circuit (MIC) balun.

BACKGROUND ART

In the past several years MIC baluns formed by a pair of coupled transmission lines have been used as four port circuits, with the unbalanced input terminal on the same end as the ground terminal, and the third and fourth terminals emitting two balun output signals which are 180° out of phase. It is difficult to achieve output signals of equal amplitude in prior art baluns, especially when the bandwidth is an octave or more Additionally, when the length of a prior art balun becomes an integral multiple of even mode half-wavelengths at select frequencies in-band, problems are incurred in the amplitude properties observed at the balun outputs due to extreme over coupling.

If such a prior art balun is used in a mixer or modulator that operates at a frequency where these effects occur, then the conVersion loss, isolation and spurious performance show a troublesome discontinuity. Performance of the prior art balun is optimized when the prior art balun uses suspended broadside coupled strip lines to achieve maximum coupling. Such baluns still fall short of having equal amplitude outputs, and they also require double sided circuitry with two transmission lines, one on each side of an extremely thin substrate.

Another type of prior art balun uses an edge-coupled pair of transmission lines which are on the same plane as the top surface of the substrate. Adequate coupling is even more difficult to achieve with this type of prior art balun, and the useful band width is much narrower. The functionality of this type of prior art balun is reduced even more if a ground plane is brought near the backside of the substrate. Consequently, these coupled microstrip baluns are seldom used because of the enhancement of the even mode of propagation and the extreme amplitude inequality and phase inaccuracy at the balun outputs.

Other types of prior art baluns such as coaxial and slot line baluns using a four port hybrid, or circuits containing magic-tees, still have band width constraints because of amplitude inequalities between balun output signals and because of resonance problems which come about because of circuit topology and line lengths. The prior art baluns that function most successfully tend to involve low dielectric constant material such as polytetrafluroethylene-type, or PTFE, materials which are physically flexible.

The drawback to the use of these materials is that one must solder such assemblies together and the construction of circuits built in this way becomes a complicated, costly and time consuming art, rather than a science of mass production with repeatable results. Regardless of the material type used, these prior art baluns are forced to be extremely thin to achieve proper coupling. As a result, mechanical reliability becomes questionable when these baluns are used under various environmental conditions. Additionally, mixers and modulators which use these prior art baluns typically see these baluns as reflective loads. This gives rise to large efficiency and performance variations.

DISCLOSURE OF THE INVENTION

The above and other problems of prior art baluns are overcome by the present invention of a balun section comprising a first input terminal, a second input terminal, a first output terminal, a second output terminal, a circuit ground, two capacitors connected in series across the first output terminal and the second output terminal, a resistor, and a transmission line which is connected at one end to the common node connection of the capacitors and at the other end to one end of the resistor and wherein the other end of the resistor is connected to a circuit ground.

A plurality of balun sections as described above can be cascaded to form a multisection balun. Such cascading of individual balun sections can be effected by connecting the first output terminal and the second output terminal of a first balun section to the first input terminal and the second input terminal, respectively, of a second balun section, this second balun section having a first output terminal and a second output terminal which can be connected to a first input terminal and a second input terminal, respectively, of a third balun section, and so on for as many repetitions as are desired.

Such multisection baluns are particularly useful when a plurality of them are connected to common circuitry to form mixers or modulators exhibiting improved operating characteristics over a broader band width than is attainable using prior art baluns.

As will be explained in detail further herein, the balun section/multisection balun design of the present inVention provides improved performance characteristics over a greater bandwidth than is possible with prior art baluns.

It is therefore an object of the present invention to provide a balun section or multisection balun exhibiting selective absorptive even mode filtering capabilities as would be necessary for terminating even mode products of a mixer.

It is another object of this invention to provide a balun section or multisection balun able to terminate even mode resonance.

It is a further object of the invention to provide a balun section or a multisection balun yielding a first output signal and a second output signal that are of equal amplitude to each other.

It is another object of the invention to provide a balun section or multisection balun employing overlay capacitors as localized electrical shields providing increased coupling for the coupled transmission lines.

It is another object of the invention to provide a multisection balun having overlay capacitors of varying capacitance whereby impedance can be tapered along the length of the multisection balun.

It is another object of the invention to provide a balun section or multisection balun having virtual ground nodes at the junction of the overlay capacitors.

It is another object of the invention to provide a balun section or a multisection balun which can be constructed in the form of multilayer circuitry and functionally adaptable to a single-sided planar-type circuit package.

It is still another object of the invention to provide a balun section or a multisection balun that can be constructed in a manner that is functional in the presence of a substrate backside ground plane, thereby permitting such balun section or multisection balun to be placed in a microstrip type of package without a sacrifice of band width or performance.

It is yet another object of the invention to provide a balun section or multisection balun that can be constructed of thick ceramics, thereby providing increased durability and reduced cost.

It is yet another object of the invention to provide a mixer or modulator comprised of at least one balun section or multisection balun described above.

The foregoing and other objectives, features and advantages of the invention will be more readily understood upon consideration of the following detailed description of certain preferred embodiments of the invention, taken in conjunction with the accompanying drawings.

Figure 1:
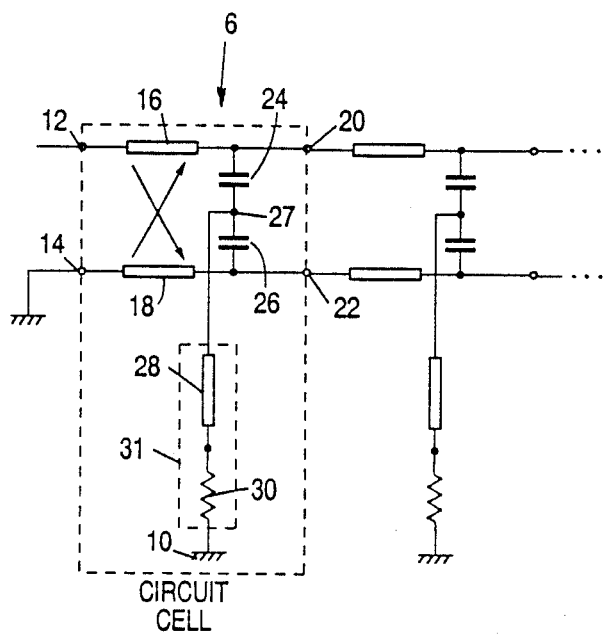
FIG. 1 is a schematic diagram for a balun section according to a first embodiment of the invention.

BEST MODES FOR CARRYING OUT THE INVENTION first embodiment of the invention is shown in FIG. 1. The balun section is comprised of a circuit cell 6 which includes a circuit ground 10, a first input terminal 12 for receiving an unbalanced input signal, and a second input terminal 14 which, if the cell 6 is the first of a plurality of such cells connected in cascade, is connected to the circuit ground 10, a first output terminal 20 and a second output terminal 22. A first transmission line 16 is connected between the first input terminal 12 and the first output terminal 20, and a second transmission line 18 is connected between the second input terminal 14 and the second output terminal 22. The first transmission line 16 and the second transmission line 18 can be short and edge-coupled.

A first capacitor 24 and a second capacitor 26 are connected in series between the first output terminal 20 and the second output terminal 22. The first capacitor 24 and the second capacitor 26 are interconnected overlay capacitors creating, at their point of intersection, a common node 27. A third transmission line 28 is connected from the common node 27 in series with a resistor 30 to the circuit ground 10. The third transmission line 28 and the resistor 30 combine to form a transformed load 31.

The desired odd mode of signal propagation has the property within the balun 6 whereby the current flows across the first transmission line 16 in a direction opposite to that of the current flowing across the second transmission line 18. That is to say, in the odd mode, the current in the first transmission line 16 is 180 degrees out of phase with the current in the second transmission line. Additionally, the currents in the two transmission lines 16 ad 18 are of nearly the same magnitude. Consequently, node 27 becomes nearly a virtual ground in the odd mode and, thus, only a small amount of current flows between the node 27 and circuit ground 10 across the resistor 30.

At the low frequency end of the band, the coupling from the first transmission line 16 to the second transmission line 18 is less because the overall balun 6 becomes physically short compared to a wavelength at the low frequency. This would normally cause higher current and higher power to exist on the first transmission line 16 because less power is shared with the second transmission line 18. However, by tying the transformed load 31 from the node 27 to circuit ground 10, it is then possible to remove some low frequency power from the first transmission line 16 because the imbalance of phase and amplitude between the signals across the first transmission line 16 and the second transmission line 18 will cause a non-zero voltage to appear at the node 27. This small amount of odd mode low frequency power reduction on the first transmission line 16 is useful to equalize the final powers of the first transmission line 16 and the second transmission line 18 so that the first output terminal 20 and the second output terminal 22 have equal amplitude voltages which are 180 degrees out of phase with each other. This is a novel property for a wide frequency bandwidth balun.

Figure 2:
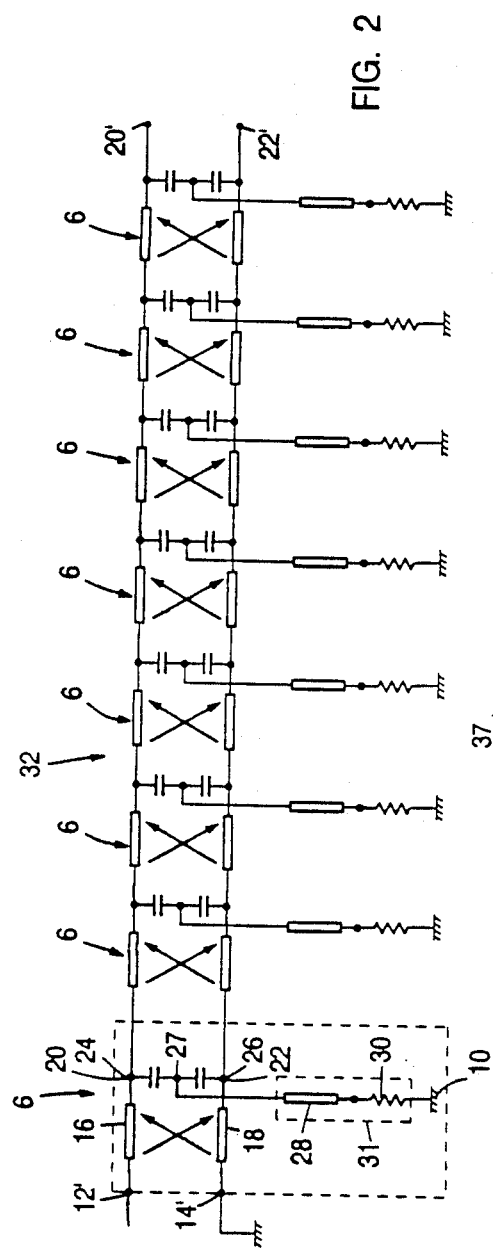
FIG. 2 is a schematic diagram of a multisection balun formed by cascading a plurality of balun sections according to the first embodiment of the invention.

Such overall amplitude equalization will in turn be realized in a first multisection balun 32, which is schematically illustrated in FIG. 2. In FIG. 2, eight balun sections, each sharing the same circuit topology as the balun section 6 illustrated in FIG. 1, have been cascaded together to make up a composite new balun, or a first multisection balun 32 having a third output terminal 20' and a fourth output terminal 22'. (The elements in the multisection balun 32 corresponding to the elements in the balun section 6 have been given the same reference numerals, primed).

The first multisection balun 32 yields balanced, antiphasal output signals throughout the bandwidth of the input signals, including input signal bandwidths of more than 2 to 18 GHz. It is the intention of this invention to create a multisection balun by cascading a number of balun sections of the type shown in FIG. 1, with the number being established by the design criteria of the desired frequency range of operation impedance match ripple and physical realizability of overlay capacitors.

It is also the intention of this invention that the value of the resistor 30 and the transforming properties of the third transmission line 28 be selected uniquely for each balun section cascaded to create a multisection balun. The resistive values and transmission line lengths of the resistors 30 and transmission lines 28, respectively, should be chosen to accomplish 1) amplitude equalization of the output signals, 2) termination of even mode excitations and 3) de-Q-ing of even mode half resonances. All three effects are discussed in detail below, and are highly desirable for all balun applications using the normal odd mode of propagation. These effects are not attainable over broad bandwidths in prior art devices.

For example, each transformed load 31 can be set to be a quarter wavelength long at a different frequency for each balun section. For amplitude equalization at low frequencies, it is necessary to make the value of the resistor 30 low and the line length of the third transmission line 28 short compared to a quarter wavelength at the low end frequency. At the high end frequency, the quarter wave transformed load 31 can be forced to be a quarter wavelength long at selected frequencies. At these selected frequencies, the low value of the resistor 30 is transformed to a higher value as loading the circuit in the hundreds of ohms. Thus, the resistor 30 presents virtually no load from the node. 27 and little power is taken from either of the transmission lines 16 or 18. At still higher frequencies, the node 27 will become an even better virtual ground to the point that, in the odd mode, no current is forced into the resistor 30. This is so because the coupled pair of the first transmission line 16 and second transmission line 18 is longer with respect to the wavelength at high frequencies. As a result, amplitude equalization is effected only in those portions of the frequency band where it is required.

As will be explained in greater detail hereinafter, coupling is enhanced by utilizing a metal overlay pad for the first capacitor 24 and the second capacitor 26 because the metal pads act as localized electrical shields for the first transmission line 16 and the second transmission line 18. This added benefit results in further increased useable low-end frequency bandwidth over the prior art.

It is another feature of the invention that by varying the overlay capacitance values of each balun section within the first multisection balun 32, it is possible to taper the odd mode impedance for the benefit of wideband impedance matching to the loads to which the first multisection balun 32 will interface at its first input terminal 12, third output terminal 20' and fourth output terminal 22'.

Besides equalizing the amplitudes of the output signals, the invention also makes it possible to terminate even mode signals which are directly excited into the first output terminal 20 and second output terminal 22 of the balun section 6 when used alone, or into the third output terminal 20' and fourth output terminal 22' of the first multisection balun 32. Even mode. signals would occur in the application of the invention as a mixer where even mode signals are generated and driven back into the normal output terminals.

When in-phase signals of equal amplitude are driven back into the first output terminal 20 and second output terminal 22 of the balun section 6, or the third output terminal 20' and the fourth output terminal 22' of the first multisection balun 32, the voltage at the node 27 o-f each balun section 6 is non-zero in relation to the even mode signal. It is possible to provide direct termination at a particular frequency by selecting the property of the third transmission line 28 and the resistor 30 comprising the transformed load 31 of each balun section 6. Typically, the third transmission line 28 will be selected to have a quarter wave transformer property. In this way, when the low value resistor is quarter wave transformed at a selected frequency range, the low value of resistance effectively becomes a higher resistance value such that the impedance of the even-mode signal matches that of the transformer load, (i.e., the resistor 30 and the third transmission line 28). This effect allows for termination of the even mode signal. In this way the transformed load 31 of each balun section 6 forms an even mode matched load in the selected frequency range. This quarter wave transforming property simultaneously allows for amplitude equalization as described previously. The fact that each balun section 6 of the multisection balun 32 can have different lengths of the third transmission line 28 and values of the resistor 30 and capacitors 24 and 26, is vital to producing a very wide bandwidth multisection balun 32 without the prior art drawbacks of unterminated even modes and amplitude imbalance.

Another unique property of the invention is the ability to de-Q, or terminate, the even mode half wavelength resonance frequencies. Prior art baluns are typically plagued by the fact that when a balun is driven in a frequency range where its physical length equals one half of the even mode wavelength, then its properties fall apart into extreme imbalance. At this point extreme overcoupling occurs and the first transmission line of the prior art balun loses power drastically.

In the present invention, the transformed load 31 functions to load down such resonances so that an extremely effective resonance de-Q-ing will occur. The phase and amplitude properties are thus reestablished as well behaved properties. As a result, the first multisection balun 32 of this invention can be made longer to support lower frequencies without the fear of bringing such resonances into the operating band.

The points of halfwave even mode resonance are dependent upon the first multisection balun 32 length. So some individual balun sections 6 comprising the first multisection balun 32 can be designed particularly to perform de-Q-ing at the known resonance frequency range.

Figure 3:
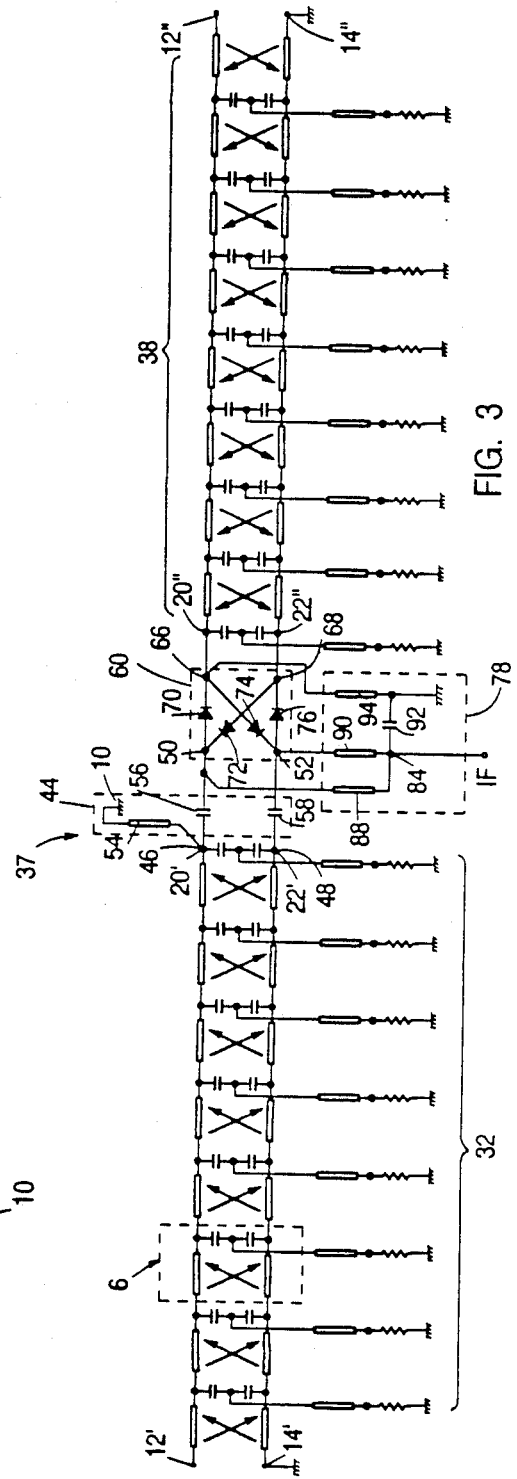
FIG. 3 is a schematic diagram of a mixer or modulator circuit showing the use of more than one multisection balun according to a third embodiment of the invention.

It is also the intention of this invention to include a mixer or modulator circuit 37 which uses at least one of the previously described balun sections 6 or first multisection balun 32. FIG. 3 shows the schematic diagram of a double balanced mixer or modulator circuit 37 using a first multisection balun 32 comprised of eight balun sections 6 and a second multisection balun 38 comprised of eight balun sections 6, with a high pass filter 44, a low pass filter 78 and a diode quad 60 connected between the outputs of the baluns 32 and 38.

The high-pass filter 44 has a pair of input terminals 46 and 48 and a pair of output terminals 50 and 52, and is connected at its input terminals 46 and 48 to the first multisection balun 32 at the third output terminal 20' and the fourth output terminal 22', respectively. The high-pass filter includes a transmission line 54 connected between a circuit ground 10 and the input terminal 46. A capacitor 56 interconnects the input terminal 46 with the output terminal 50. Another capacitor 58 interconnects the input terminal 48 with the output terminal 52.

A diode quad 60 is connected in the circuit 37 such that a first terminal of the diode quad 60 is taken at the output terminal 50 of the high-pass filter 44, a second terminal of the diode quad 60 is taken at the output terminal 52 of the high-pass filter 44, a third terminal 66 of the diode quad 60 is attached to an output terminal 20" of the second multisection balun 38, and a fourth terminal 68 of the diode quad 60 is attached to the output terminal 22" of the second multisection balun 38.

A first diode 70 is connected at its anode to the first terminal 50 and at its cathode to the third terminal 66 of the diode quad 60. The anode of a second diode 72 is connected to the fourth terminal 68 and the cathode of the diode 72 is connected to the first terminal 50 of the diode quad 60. A third diode 74 is attached at its anode to the third terminal 66 and at its cathode to the second terminal 52 of the diode quad 60. A fourth diode 76 is connected at its anode to the second terminal 52 and at its cathode to the fourth terminal 68 of the diode quad 60.

A low-pass filter 78 is connected in the circuit 37 between the output of the balun 32 and the diode quad 60. The low-pass filter 78 includes a transmission line 88 attached between the terminal 50 and an output terminal 84 of the low-pass filter 78. Another transmission line 90 is attached between the terminal 52 and the output terminal 84 of the low-pass filter 78. A capacitor 92 is connected between the output terminal 84 and the circuit ground 10. Still another transmission line 94 is connected between the third terminal 66 of the diode quad 60 and circuit ground 10. The output terminal 84 of the low-pass filter 78 is the port at which the intermediate frequency can be extracted when the circuit 37 functions as a downconverting mixer.

The circuit 37 can function as either an upconverting mixer or as a downconverting mixer. In the downconverting mixer mode, the first input terminal 12' of the first multisection balun 32 is attached to a local oscillator (not shown) such that an unbalanced local oscillator output signal, LO, is the signal input to the first input terminal 12'. A balanced antiphasal pair of LO signals are then presented at the third output terminal 20' and the fourth output terminal 22' of the first multisection balun 32. After passing through the high-pass filter 44, the pair of LO signals serves to drive the first terminal 50 and the second terminal 52 of the diode quad 60.

An input terminal 12" of the second multisection balun 38 acts as a receiver input for radio frequency information-bearing RF signals. An input terminal 14" of the second multisection balun 38 is connected to circuit ground 10. The output terminal 20" and the output terminal 22" of the second multisection balun 38 provide a balanced antiphasal pair of RF signals which drive the third terminal 66 and fourth terminal 68, respectively, of the diode quad 60

The LO signal is the dominant signal and acts as the switching mechanism for the circuit 37. The LO signal is mixed with the RF signal, and the resulting IF signal is extracted.

The output terminal 84 of the low-pass filter 78 becomes the port at which the intermediate frequency, IF, is extracted.

The transmission line 94 provides one of the ground returns for the IF and dc components by shunting the output terminal 20" of the second multisection balun 38 to circuit ground 10. The transmission line 54 together with the capacitor 56 and 58 form a diplex signal distribution filter routing the IF signal to the output terminal 84 and preventing the IF from reaching the LO input at the first input terminal 12'. Additionally, this diplex filter passes the high frequency LO signals on to the diode quad 60.

The transmission line 88, the transmission line 90 and the capacitor 92 combine to pass only the low frequency IF signal, while rejecting signals in the RF or LO frequency range.

It can thus, be understood that the diplex filtering serves to keep the IF signal from backing into the first multisection balun 32, and to prevent the LO and RF, signal from appearing at the IF port, i.e., the output terminal 84.

As even mode signals are generated by the diode quad 60 due to slight unbalance or diode mismatch, these undesirable signals will be terminated within the first multisection balun 32 and the second multisection balun 38. This has a smoothing effect on the mixer parameters versus frequency. The conversion loss, compression, third order intermodulation distortion, and, the spurious signal produced by the even harmonics of the LO signal plus or minus the even harmonics of the RF signal, i.e. the even by even spurious rejection response, will all be flatter due to the termination of the even mode signals.

Because the first multisection balun 32 and the second multisection balun 38 each yield output signals of equal amplitude, the LO-to RF port isolation is improved, and the even by even spurious signals appearing on output terminal 84 are further reduced.

Common mode rejection occurs when signals at different frequencies simultaneously enter the LO port, i.e., the first input terminal 12', and mix to give a small amplitude IF product. Ideally, no product would appear. By employing the multisection baluns of the invention, common mode rejection is improved (increased) over prior art baluns..

When the circuit 37 is used as an upconverting mixer, the circuit 37 functions as described above with the following exceptions: the output terminal 84 becomes an IF input port, and the input terminal 12" becomes an RF transmitting port. The LO signal continues to serve as the switching mechanism.

When the circuit 37 is used as a modulator, the circuit 37 functions as described above for an upconverting mixer with the following exceptions: the signal input to the first input terminal 12' is a low level carrier signal or RF input, and the IF input becomes the highest power signal and serves as the switching mechanism.

Whether the circuit 37 is used as a downconverting mixer, an upconverting mixer or a modulator, the use of the above-described multisection baluns in the circuit 37 will yield improved operation over the prior art.

Figure 4:
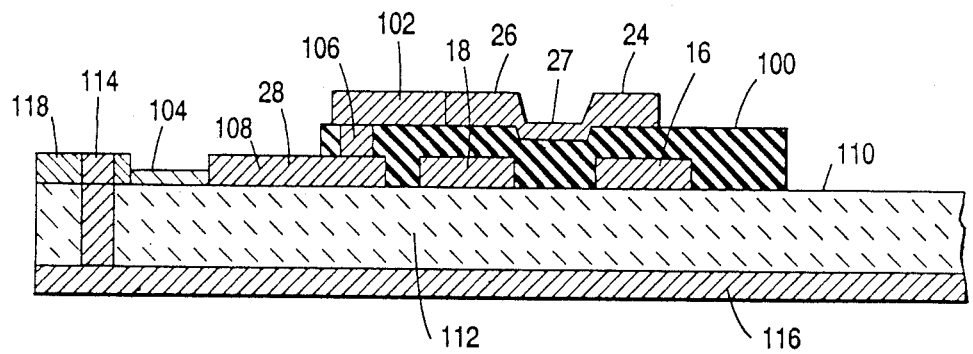
FIG. 4 is a vertical cross-sectional view of the balun section schematically depicted in FIG. 1 taken along the lines 4—4 in FIG. 5, showing the multiple layers of thin film circuitry grounded to a substrate backside ground plane.

A cross-sectional physical illustration of the balun section 6 in the form of a multilayer thin film circuit is shown in FIG. 4. A dielectric layer 100 is deposited over the coupled pair of the first transmission line 16 and the second transmission line 18 which are on the top surface of a ceramic substrate 112. The dielectric 100 can be chosen to be a material which, in part, defines the capacitance of the first overlay capacitor 24 and the second overlay capacitor 26.

The first overlay capacitor 24 and second overlay capacitor 26 are physically joined together at a vertical planar surface, as viewed in the figure. This planar surface corresponds to the node 27 which appears as virtual ground to the odd mode signal. The FIG. 4 view makes it clear how, when the first capacitor 24 and the second capacitor 26 are joined together at the planar surface of the node 27, a resulting overlaying metal pad is created that acts as a localized electrical shield for the E-field coupling between the first transmission line 16 and the second transmission line 18.

The first capacitor 24 and the second capacitor 26 are selected to have a metal overlay pad having a maximum cross-dimension less than one quarter of the frequency wavelength of the signal across the balun.

The transmission line 28 can be designed in a variety of formats. The design illustrated in FIG. 4 shows the transmission line 28 as comprising a metal line 102 running along the top surface of the dielectric 100, a metal line 108 running along the top surface 110 of the substrate 112, and a plated-through hole 106 through the dielectric 100 which electrically interconnects the metal lines 102 and 108.

The resistor 104 is deposited on the top surface of the substrate 112 and a second plated through-hole 114 through the substrate 112 is connected at its top end to the resistor 104, and is connected at its bottom end to the circuit ground 10 in the form of a substrate backside ground plane 116. The first line 102 thus connects the node 27 through the through-hole 106 to the line 108 which is connected to the resistor 104 in a planar fashion.

This configuration permits the balun to be compatible with microstrip circuitry. Alternatively, the circuit ground 10 is in the form of a metal track 118 running along the perimeter of the top surface 110 of the substrate 112, and attached to a second plated through-hole 114 at the top end of the second plated through-hole 114. This configuration permits the balun 6 to be suspended from a shelf, thereby creating an air pocket beneath the substrate 112. In this alternate construction, the ground plane 116 is omitted in the proximity of transmission lines 16 and 18 and exists only around the bottom perimeter. This perimeter ground on the backside serves only to ground the circuit via hole 114.

It should be realized that the balun section 6 can be attached to a substrate 112 consisting of a thick or a thin ceramic material. When a thick ceramic substrate 112 is used, only a negligible amount of compactness is lost as compared to the thin substrate design, while a substantial improvement in substrate strength is realized. This permits the use of more durable and reliable baluns that can be more cost effectively mass produced.

Figure 5:
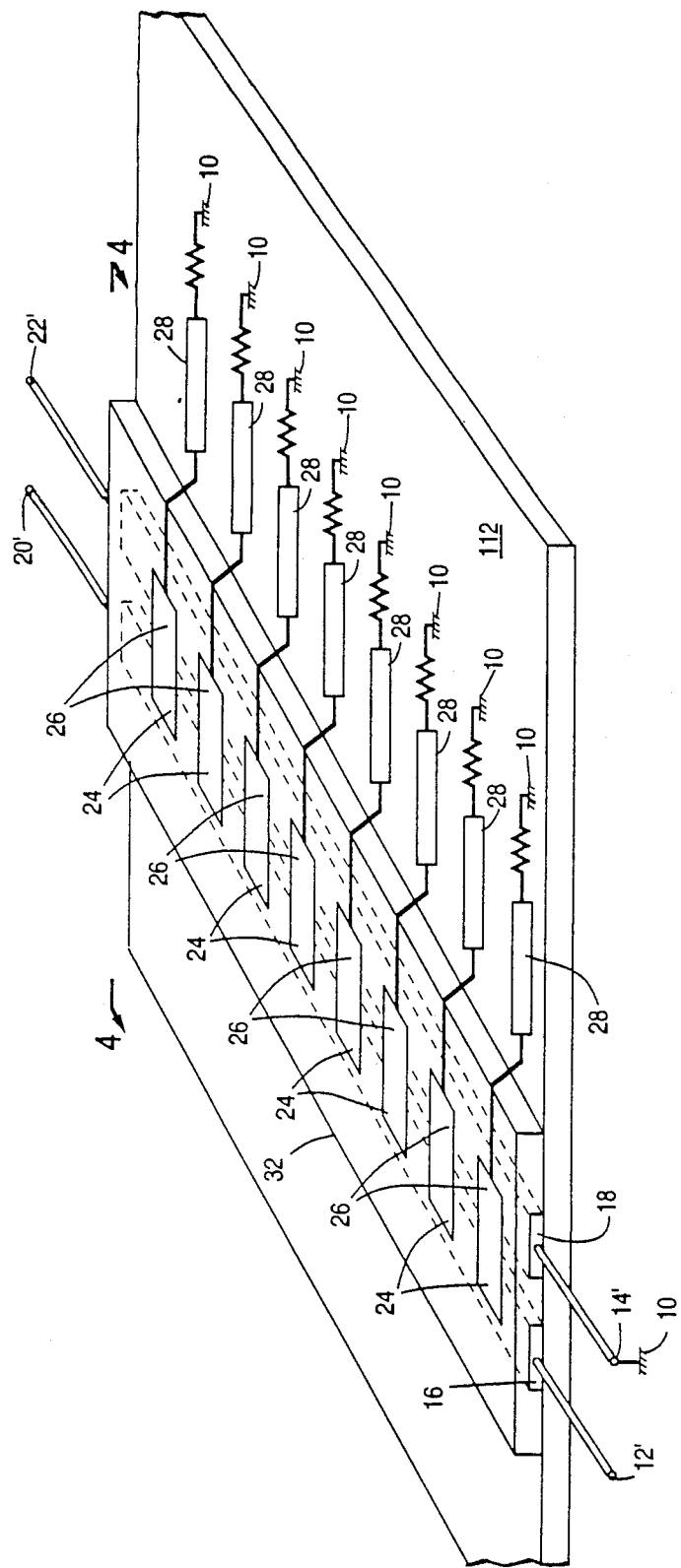
FIG. 5 is a partially schematic, perspective illustration of the multisection balun shown in FIG. 2 as it would appear on the top surface of a substrate.

FIG. 5 shows a physical isometric view of the first multisection balun 32 shown schematically in FIG. 2. The multilayer single-sided circuitry arrangement discussed previously for constructing the balun section 6, applies to the construction of the multisection balun 32 as well. Likewise, the multisection balun 32 can be made for microstrip or suspension circuitry, and can be used with a thick ceramic substrate.

Figure 6:
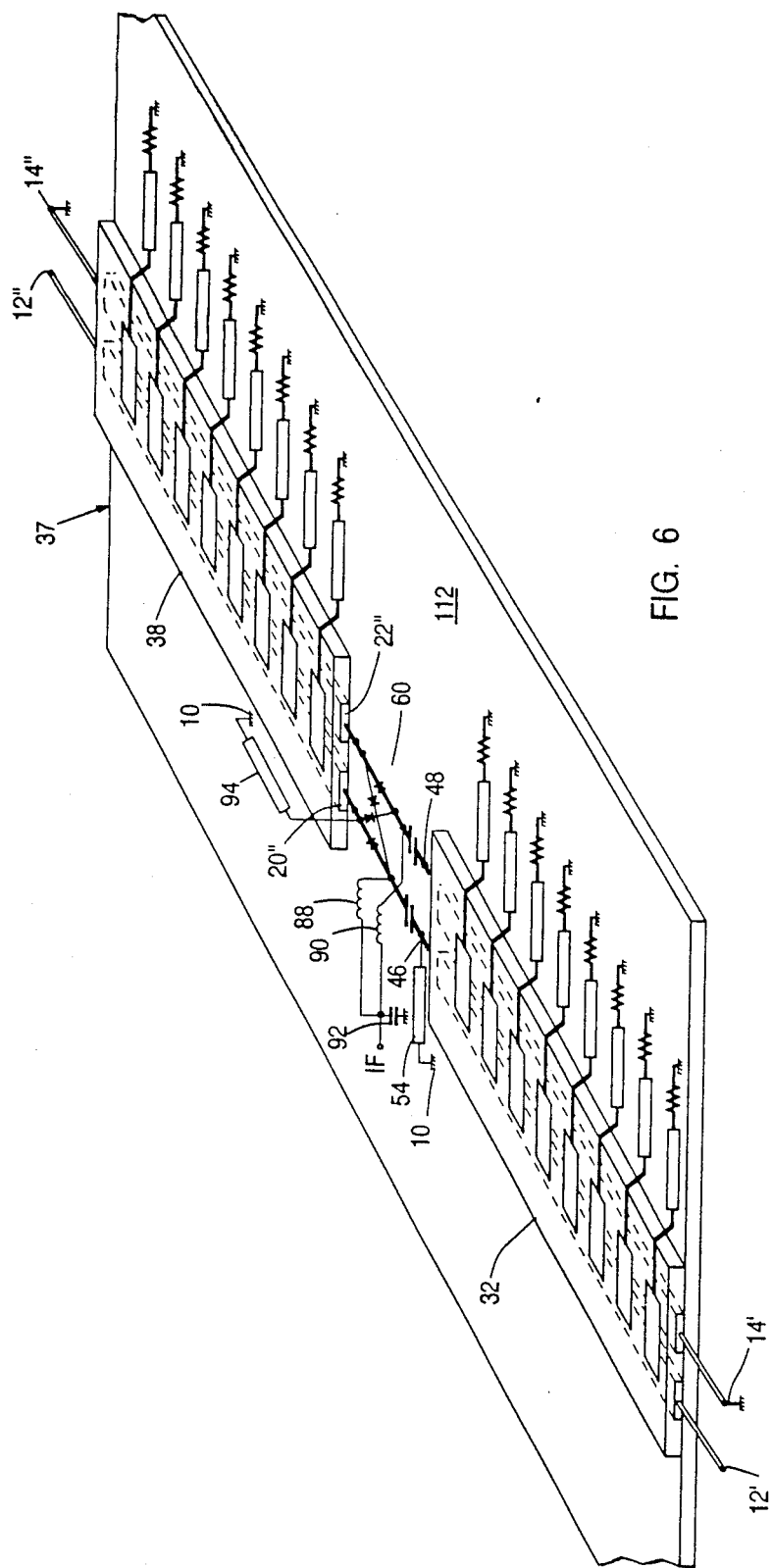
FIG. 6 is a partially schematic, perspective illustration of a circuit usable as a mixer or modulator showing the use of more than one multisection balun of the type shown in FIG. 2.

FIG. 6 shows a physical isometric view of the circuit 37 shown schematically in FIG. 3. Whether the circuit is used as a downconverting mixer, an upconverting mixer or a modulator, the circuit 37 can be constructed as a multilayer single-sided circuit for microstrip or suspension circuitry, and can be used in conjunction with a thick ceramic substrate.

What is claimed is:

1. A balun section comprising:
   a circuit ground;
   first and second input terminals;
   first, second and third transmission lines;
   first and second output terminals;
   first and second capacitors; and
   a resistor;
wherein the first and second capacitors are connected in series between the first and second output terminals and form a common node at the point that the first capacitor connects to the second capacitor, the third transmission line is connected in series with the resistor from the common node to the circuit ground, the first transmission line is connected between the first input terminal and the first output terminal, and the second transmission line is connected between the second input terminal and the second output terminal.

2. A multisection balun comprised of a plurality of balun sections as recited in claim 1, connected in series such that the multisection balun has third and fourth input terminals which are the first and second input terminals, respectively, of the first of the plurality of series connected balun sections and third and fourth output terminals which are the first and second output terminals, respectively, of the last of the plurality of series connected balun sections.

3. A system comprising a common circuit and a pair of multisection baluns as recited in claim 2 connected such that the third and fourth output terminals of each multisection balun drives the common circuit.

4. The system of claim 3 wherein the common circuit includes a high-pass filter.

5. The system of claim 4 wherein the high-pass filter comprises:
   a fourth transmission line;
   a third capacitor;
   a fourth capacitor; and
wherein the fourth transmission line is connected between the third output terminal of one of the multisection baluns and the circuit ground, the third capacitor is connected in series with the third output terminal of the one multisection balun, and the fourth capacitor is connected in series with the fourth output terminal of the one multisection balun.

6. The system of claim 5 wherein the common circuit includes a diode quad having fifth, sixth seventh and eighth terminals.

7. The system of claim 6 wherein the fifth and sixth terminals are connected in series with the third and fourth capacitors to the third and fourth output terminals of the one multisection balun, respectively, and the seventh and eighth terminals are connected to the third and fourth output terminals, respectively, of the other of the pair of multisection baluns connected to the common circuit.

8. The system of claim 6 wherein the diode quad comprises:
   a first diode having an anode which is connected to the fifth terminal and a cathode connected to the seventh terminal;
   a second diode having an anode connected to the sixth terminal and a cathode connected to the eighth terminal;
   a third diode having a cathode connected to the fifth terminal and an anode connected to the eighth terminal; and
   a fourth diode having a cathode connected to the sixth terminal and an anode connected to the seventh terminal.

9. The system of claim 3 wherein the common circuit includes a low-pass filter.

10. The system of claim 3 wherein a seventh transmission line is connected from the third output terminal of the second multisection balun to the circuit ground.

11. The system of claim 8 wherein the common circuit includes a low-pass filter comprising:
   an intermediate frequency output terminal;
   a fifth transmission line connected between the fifth terminal and the intermediate frequency output terminal;
   a sixth transmission line connected between the sixth terminal and the intermediate frequency output terminal; and
   a fifth capacitor connected between the intermediate frequency output terminal and the circuit ground.

12. The system of claim 11 wherein a seventh transmission line is connected from the third output terminal of the second multisection balun to the circuit ground.

13. The balun section of claim 1 wherein the first transmission line is in closely spaced proximity to the second transmission line.

14. The balun section of claim 1 wherein the first transmission line is edge-coupled to the second transmission line.

15. The balun section of claim 1 wherein the first transmission line is in closely spaced proximity to[and edge-coupled with, the second transmission line.

16. The balun section of claim 15 wherein each capacitor comprises a capacitor pad having a maximum cross-dimension is less than one quarter of the frequency wavelength of the signal across the balun.

17. The balun section of claim 1 wherein the third transmission line and the resistor combine to form a transformed load.

18. The balun section of claim 17 wherein the length of one third transmission line and the resistance of the resistor are selected so that the transformed load substantially terminates even mode signal propagation and even mode resonance.

19. A balun section as recited in claim 1 wherein the lengths of the first, second and third transmission lines, and the values of the first and second capacitors and the resistor are selected so that a signal applied across the first and second input terminals will generate a first output signal at the first output terminal and a second output signal at the second output terminal which is of substantially equal amplitude to the first output signal.

20. The balun section of claim 19 wherein the transmission line lengths and the capacitor and resistor values are chosen in a manner to selectively and substantially terminate even mode signal propagation by the balun.

21. The balun section of claim 19 wherein the transmission line lengths and the capacitor and resistor values are chosen in a manner to selectively the balun.

22. The multisection balun of claim 2 wherein the transmission line lengths and the capacitor, and resistor values are chosen in a manner to selectively taper the impedance along the length of the multisection balun.

23. The balun section of claim 1 wherein the balun section is in the form of an integrated circuit with the first capacitor and the second capacitor comprising a capacitor pad which overlays the first transmission line and the second transmission line.

24. The balun section of claim 23 comprising a substrate having at least one planar side and wherein the integrated circuit is formed on the one planar side.

25. A multisection balun comprised of a plurality of balun sections as recited in claim 1 whereby the first and second and third transmission lines and the values of the first and second capacitors and the resistor, are selected in all balun sections, so that a signal applied across the third and fourth input terminals of the multisection balun will generate a first output signal at the third output terminal, and a second output signal at the fourth output terminal which is of substantially equal amplitude to the first output signal.

* * * * *